US007339719B1

(12) United States Patent
Haskett et al.

(10) Patent No.: US 7,339,719 B1
(45) Date of Patent: Mar. 4, 2008

(54) PACKAGING OF FREQUENCY-DOUBLED, EXTENDED-CAVITY, SURFACE-EMITTING LASER COMPONENTS ON A COMMON SUBSTRATE

(75) Inventors: Bradley M. Haskett, Allen, TX (US); Steven M. Penn, Plano, TX (US); Terry A. Bartlett, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/507,784

(22) Filed: Aug. 22, 2006

(51) Int. Cl.
*G02F 1/35* (2006.01)

(52) U.S. Cl. ........................................ 359/326; 372/22

(58) Field of Classification Search ........ 359/326–330; 372/22, 98, 99, 100, 103, 108
See application file for complete search history.

(56) References Cited

U.S. PATENT DOCUMENTS 6,839,365 B1 * 1/2005 Sonoda et al. ................ 372/22

OTHER PUBLICATIONS

Mooradian, A. et al., "High Power Extended Vertical Cavity Surface Emitting Diode Lsers and Arrays and their Applications," Micro-Optics Conference, Tokyo, JAPAN (4 pages), Nov. 2, 2005.

Presentation entitled "Novalux—The Dawn of Lsers in Projection", Projection Summit '06, Novalux, Inc. Sunnyvale, CA; http;//www.novalux.com/assets/downloads;lasers_in_projection.pdf (20 pages), Jun. 6, 2006.

* cited by examiner

*Primary Examiner*—Hemang Sanghavi
(74) *Attorney, Agent, or Firm*—Wade James Brady, III; Frederick J. Telecky, Jr.

(57) ABSTRACT

In one embodiment, a laser module comprising an optical element, a frequency converter, a selective reflector, and one or more surface-emitters, each coupled to a common substrate, wherein the emitters, the optical element, the frequency converter, and the selective reflector are positioned with respect to each other such that at least a portion of the coherent light emitted from the surface-emitters travels through the optical element, through the frequency converter and through the selective reflector. In a method embodiment, a method for frequency converting light generated by a surface-emitter, wherein the light passes through an optical element, a frequency converter, and a selective reflector, each coupled to a common substrate.

20 Claims, 3 Drawing Sheets

100
112
108
114
106b
106a
104
110
102
118
116

PACKAGING OF FREQUENCY-DOUBLED, EXTENDED-CAVITY, SURFACE-EMITTING LASER COMPONENTS ON A COMMON SUBSTRATE

TECHNICAL FIELD OF THE INVENTION

This invention relates in general to lasers, and, in particular, to an improved method of packaging the same.

BACKGROUND OF THE INVENTION

Within the optics industry, numerous applications require a light source capable of producing multiple Watts of visible light. For example, DLP® high definition televisions (HDTV) incorporate high-power lamps or light-emitting diodes (LED). More recently, vertical external cavity surface-emitting lasers (VECSELs) have been developed which, when combined with a frequency-doubling crystal, form a laser module capable of producing sufficient visible light to power video displays. Conventional packaging of the optical components that make up the laser module is expensive and difficult to manufacture for a variety of reasons.

SUMMARY

In one embodiment, a laser module comprising an optical element, a frequency converter, a selective reflector, and one or more surface-emitters, each coupled to a common substrate, wherein the emitters, the optical element, the frequency converter, and the selective reflector are positioned with respect to each other such that at least a portion of the light emitted from the surface-emitters travels through the optical element, through the frequency converter and through the selective reflector.

In a method embodiment, a method for frequency converting light generated by a surface-emitter, wherein the light passes through an optical element, a frequency converter, and a selective reflector, each coupled to a common substrate.

Depending on the specific features implemented, particular embodiments of the present invention may exhibit some, none, or all of the following technical advantages. Various embodiments may be capable of aligning within tight tolerances using precision semiconductor-type equipment. In addition, various embodiments may have temperature control components integrated into the common substrate. Other technical advantages will be readily apparent to one skilled in the art from the following figures, description and claims. Moreover, while specific advantages have been enumerated, various embodiments may include all, some or none of the enumerated advantages.

BRIEF DESCRIPTION OF THE DRAWINGS

For a more complete understanding of the present invention, and for further features and advantages thereof, reference is now made to the following description taken in conjunction with the accompanying drawings, in which.

DETAILED DESCRIPTION OF EXAMPLE EMBODIMENTS

Particular examples specified throughout this document are intended for example purposes only, and are not intended to limit the scope of the present disclosure. In particular, this document is not intended to be limited to a particular application, such as, video display. Moreover, the illustrations in FIGS. 1A through 4 are not intended to be to scale.

Figure 1A:
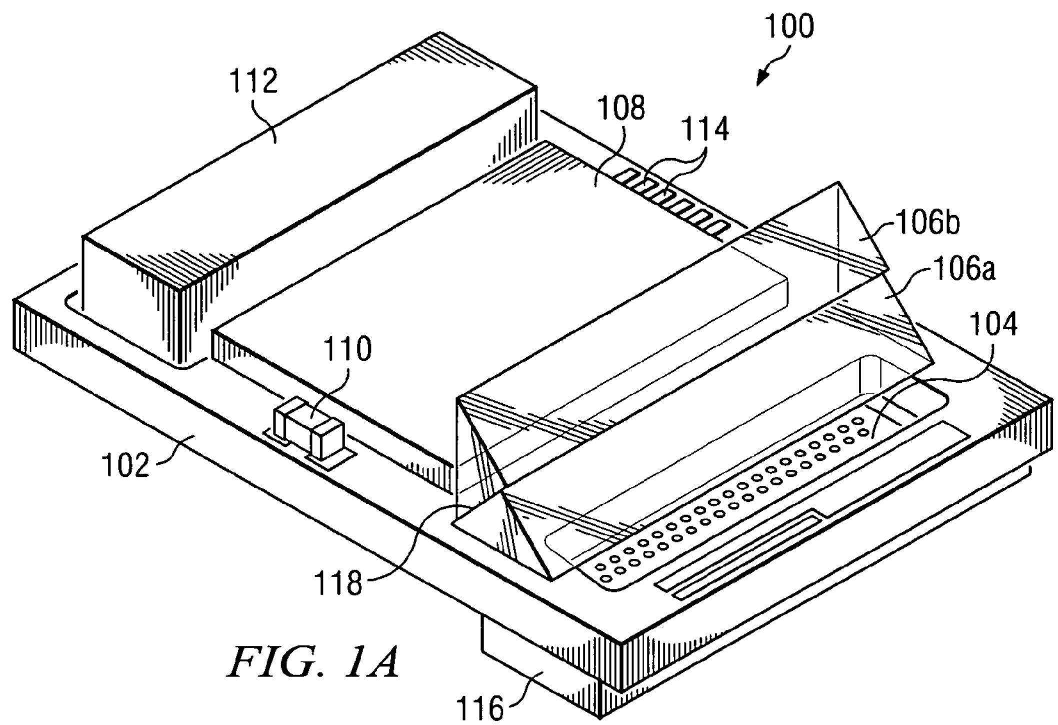
FIG. 1A is a perspective view illustrating a method of forming a portion of a laser module.

FIG. 1A is a perspective view of one embodiment of a portion of a laser module 100. In this example, a laser module 100 comprises a system of components attached to a common substrate 102 and is capable of producing sufficient visible light for display applications. Substrate 102 may comprise, for example, silicon or a multi-layer co-fired ceramic header.

In this particular example, a surface-emitter 104 and substrate 102 are attached in substantially parallel planes. Surface-emitter 104 may comprise, for example, a plurality of vertical-cavity surface-emitters that produce diffraction-limited Gaussian beams of infrared (IR) light; however, any suitable device that emits light that may be used directly or indirectly by a light modulator may be used.

In this particular example, an optical element 106 is capable of reflecting, polarizing, and beam-splitting light. Optical element 106 comprises, in this embodiment, two right triangle-shaped total internal reflection (TIR) prisms **106*a* and 106*b* bonded together and separated by a beam-splitting and polarizing surface as indicated by reference number 10. A surface indicated by reference number 120 of prism 106*a* is attached substantially parallel to substrate 102 and outwardly from surface-emitter 104. In this example, prism 106*b* is disposed outwardly from prism 106*a*. Depending on the desired optical output from laser module 100, other embodiments may not include prism 106*b***. Although this example uses TIR prisms, other selectively reflective elements may be used without departing from the scope of the present disclosure.

In this example, a frequency converter 108 is attached to substrate 102. Frequency converter 108 may comprise, for example, crystals capable of harmonic generation such as, for example, periodically poled lithium niobate (PPLN) crystals or Lithium Triborate $LiB_3O_5$ (LBO) crystals.

In this example, a selective reflector 112 is attached to substrate 102 and is substantially parallel to surface-emitter 104. Selective reflector 112 may comprise, for example, one or more selective mirrors, each mirror transmitting specific frequencies of visible light while reflecting IR.

Conventional packaging of the optical components that make up visible laser modules is expensive and difficult to manufacture for a variety of reasons. For example, as recognized by the teachings of the invention, the various conventional optical components do not have practical mounting surfaces that are on a common plane, or even mutually parallel planes. This complicates aligning the components within tight tolerance requirements. In addition, the laser emitter generates a significant amount of heat that must be efficiently removed from the module, while the frequency-doubling crystal must be maintained at a very specific temperature and therefore must be thermally isolated from the laser emitter.

Unlike conventional laser modules described in the background, surface-emitter 104, optical element 106, and frequency converter 108 are attached to a common substrate, where they may be aligned within tight tolerances using precision semiconductor-type die attach equipment. In addition, selective reflector 112 may be aligned to the remainder of laser module 100 based on the optical output from laser module 100. Each component may be held in place by, for example, solder or a very stable adhesive.

Unlike conventional laser modules described in the background, frequency converter 108 and surface-emitter 104 are attached to a common substrate comprising temperature-controlling components. For example, frequency converter 108 may be thermally isolated from surface-emitter 104 by means of an insulative substrate material, such as alumina for example. In addition, frequency converter 108 may be heated to a controlled temperature, as measured by thermistor 110, by a heater 114 integrated into substrate 102. To remove the heat generated by surface-emitter 104, a heat sink 116 may be brazed or otherwise attached to substrate 102. Heat sink 116 may comprise, for example, a highly conductive metal such as copper-tungsten or a thermally conductive ceramic such as aluminum-nitride.

Figure 1B:
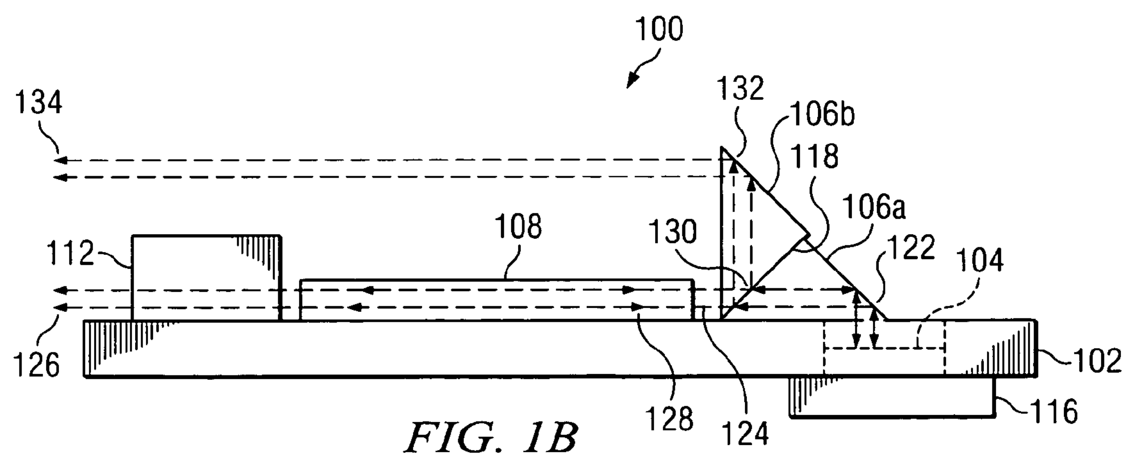
FIG. 1B is one example of a cross sectional view illustrating one embodiment of a portion of a laser module.

FIG. 1B is a cross section view of one embodiment of a portion of laser module 100. In this example, surface-emitter 104 comprises a plurality of vertical-cavity surface-emitters that produce diffraction-limited Gaussian beams of infrared (IR) light; however, any suitable device that emits light that may be used directly or indirectly by a light modulator may be used.

In this particular example, the IR output from surface-emitter 104 is folded 90 degrees and polarized by optical element 106 as indicated by reference number 122. The IR output from optical element 106 as indicated by reference number 124 passes through a frequency converter 108, which converts at least a portion of the IR beam into visible light. Although this example uses TIR prisms, other reflective elements may be used without departing from the scope of the present disclosure.

In this example, selective reflector 112 is capable of transmitting specific frequencies of visible light converted within frequency converter 108, while reflecting other frequencies of light. Laser module 100 outputs the visible light transmitted through selective reflector 112 as indicated by reference number 126.

In this example, light reflected from selective reflector 112 returns back through frequency converter 108 as indicated by reference number 128. As the IR reflected from selective reflector 112 returns through frequency converter 108, at least a portion of the IR beam converts to visible light.

In this example, the beam-splitting surface 118 within optical element 106 reflects a range of visible light 90 degrees, as indicated by reference number 130, while transmitting other frequencies, including IR. The reflected visible light folds another 90 degrees, as indicated by reference number 132, by a surface of 106*b* and outputs from laser module 200 in direction parallel to the light transmitted through selective reflector 112, as indicated by reference number 134. The transmitted IR folds 90 degrees by a surface of 106*a*, as indicated by reference number 122, reflects off surface-emitter 104 and combines with the output from surface-emitter 104.

Figure 2A:
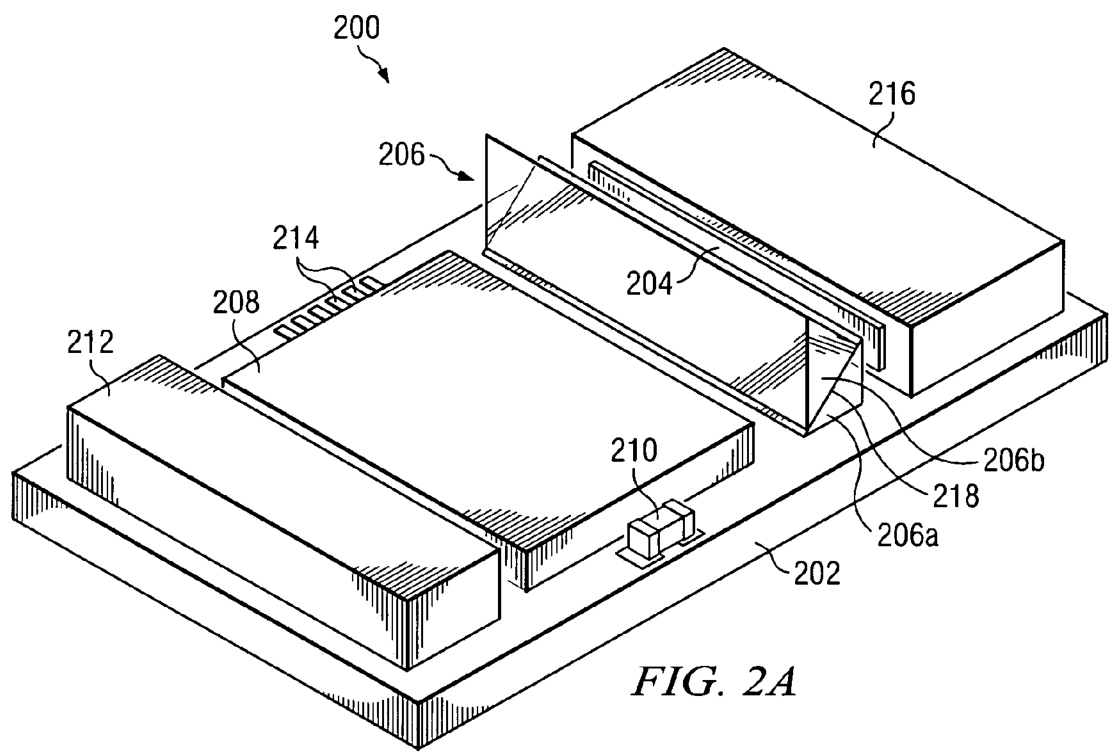
FIG. 2A is a perspective view illustrating a method of forming a portion of a laser module.
Figure 2B:
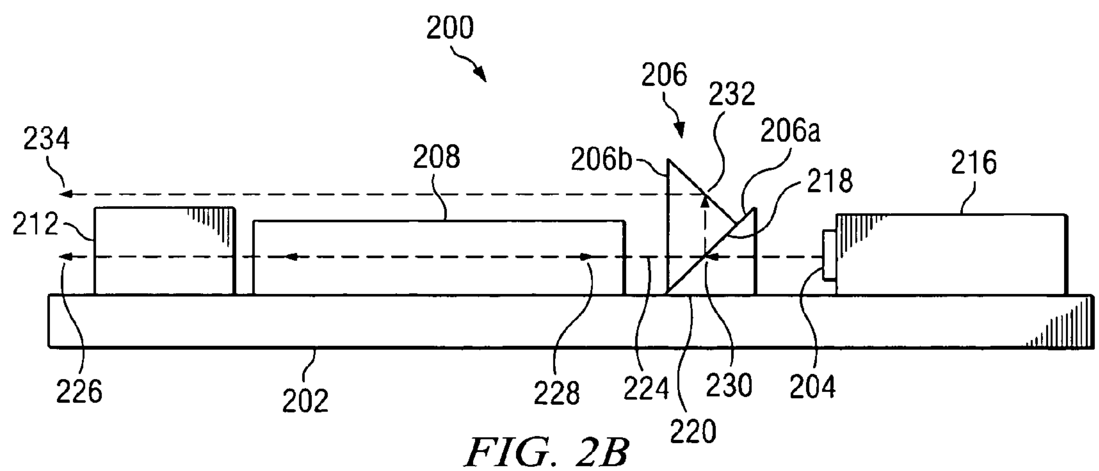
FIG. 2B is one example of a cross sectional view illustrating one embodiment of a portion of a laser module.
Figure 3A:
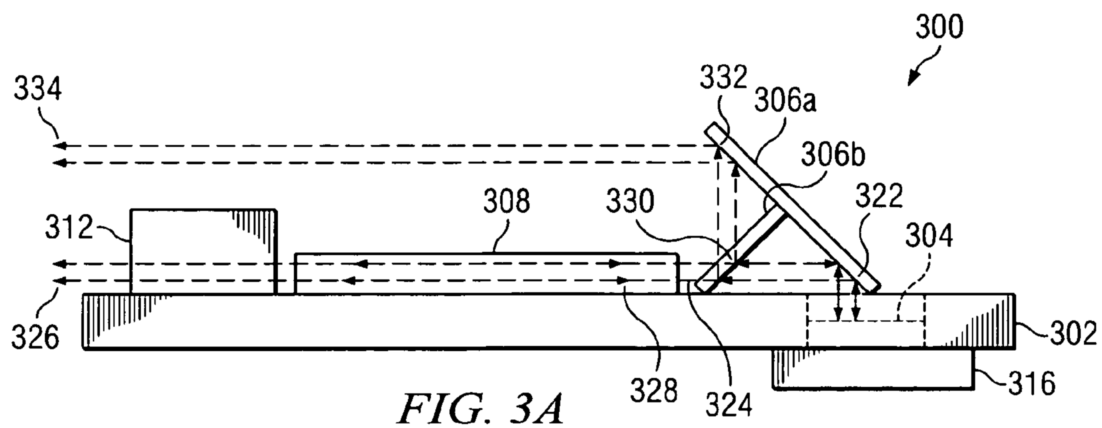
FIGS. 3A and 3B are cross sectional views illustrating alternative examples of a method of forming a portion of a laser module.
Figure 3B:
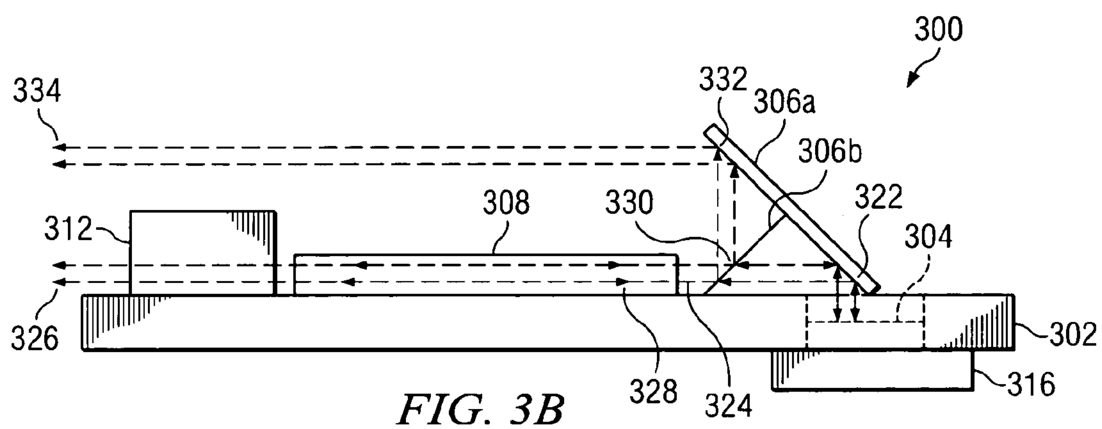
Figure 4:
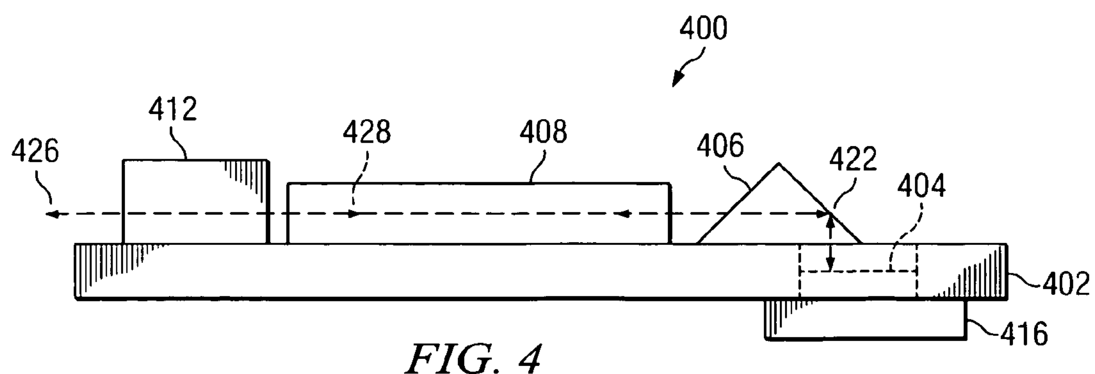
FIG. 4 is a cross section view of one embodiment of a portion of laser module 400 comprising a single output.

Thus, by packaging the laser module 100 components on a common substrate each component may be aligned in a single active alignment using precision equipment. This greatly facilitates the manufacturability of laser module 100 while possibly shrinking the package size. Other embodiments may comprise alternative components or alternative component placements without departing from the scope of the present disclosure. For example, FIGS. 2A and 2B illustrate an alternative coupling for surface-emitter 104 and the corresponding optical components that direct the light path. However, the embodiment in FIG. 1 may be preferable since it can be implemented with fewer component alignment steps. FIGS. 3A and 3B illustrate examples of alternative components that may make up the optical element 106. FIG. 4 illustrates an example of an alternative embodiment of a laser module that that produces a single output.

FIG. 2A is a perspective view of an alternative embodiment of a portion of a laser module 200. In this example, laser module 200 comprises a system of components attached to a common substrate 202 and is capable of producing multiple Watts of visible light. Substrate 202 may comprise, for example, silicon or a multi-layer co-fired ceramic header.

In this particular example, surface-emitter 204 is attached to a surface of a right-angle block 216 disposed outwardly from substrate 202. Right-angle block 216 and substrate 202 are attached in substantially parallel planes. Right-angle block 216 may comprise, for example, a highly conductive metal such as copper-tungsten or a thermally conductive ceramic such as aluminum-nitride. Surface-emitter 204 may comprise, for example, a plurality of vertical-cavity surface-emitters that produce diffraction-limited Gaussian beams of infrared (IR) light; however, any suitable device that emits light that may be used directly or indirectly by a light modulator may be used.

In this particular example, an optical element 206 is capable of polarizing and beam-splitting the optical output from surface-emitter 204. In addition, optical element 206 comprises two right triangle-shaped total internal reflection (TIR) prisms 206*a* and 206*b* bonded together and separated by a beam-splitting and polarizing surface, in this example, as indicated by reference number 218. A surface indicated by reference number 220 of prism 206*a* is attached substantially parallel to substrate 202 while another surface of 202*a* is substantially parallel to surface-emitter 204. In this example, TIR prism 206*b* is disposed outwardly from TIR prism 206*a*. Depending on the desired optical output from laser module 200, other embodiments may not include prism TIR 206*b*. Although this example uses TIR prisms, other reflective elements may be used without departing from the scope of the present disclosure.

In this example, a frequency converter 208 is attached to substrate 202. Frequency converter 208 may comprise, for example, crystals capable of harmonic generation such as, for example, periodically poled lithium niobate (PPLN) crystals or Lithium Triborate LiB3O5 (LBO) crystals.

In this example, a selective reflector 212 is attached to substrate 202 and is substantially perpendicular to the surface-emitter 204 surface; however, other configurations may be used, involving those in which the reflector is closer to parallel than perpendicular to the surface-emitter 204 surface. Selective reflector 212 may comprise, for example, one or more selective mirrors, each mirror transmitting specific frequencies of visible light while reflecting IR.

Unlike conventional laser modules described in the background, right-angle block 216, optical element 206, and frequency converter 208 are attached to a common substrate, wherein they may be aligned within tight tolerances using precision semiconductor-type die attach equipment. In addition, the selective reflector 212 may be aligned to the remainder of laser module 200 based on the optical output from laser module 200. Each component may be held in place by, for example, solder or a very stable adhesive.

Unlike conventional laser modules described in the background, frequency converter 208 and surface-emitter 204 are attached to a common substrate comprising temperature-controlling components. For example, frequency converter 208 may be thermally isolated from surface-emitter 204 by means of an insulative substrate material, such as alumina for example. In addition, frequency converter 208 may be heated to a controlled temperature, as measured by thermistor 210, by a heater 214 integrated into substrate 202. Right-angle block 216 is capable of removing from substrate 202 the heat generated by surface-emitter 204.

FIG. 2B is a cross section view of one embodiment of a portion of laser module 200. In this example, surface-emitter 204 comprises a plurality of vertical-cavity surface-emitters that produce diffraction-limited Gaussian beams of infrared (IR) light; however, any suitable device that emits light that may be used directly or indirectly by a light modulator may be used.

In this example, the IR output from surface-emitter 204 is polarized as it passes through optical element 206 in a direction substantially parallel to the surface of substrate 202, as indicated by reference number 230. Depending on the desired optical output from laser module 200, other embodiments may not include prism TIR 206*b*. Although this example uses TIR prisms, other selectively reflective elements may be used without departing from the scope of the present disclosure.

The IR output from optical element 206 passes through a frequency converter 208, which converts at least a portion of the IR beam into visible light.

In this example, selective reflector 212 is capable of transmitting specific frequencies of visible light converted within frequency converter 208, while reflecting other frequencies of light. Laser module 200 outputs the visible light transmitted through selective reflector 212, as indicated by reference number 226.

In this example, light reflected from selective reflector 212 returns back through frequency converter 208. As the IR reflected from selective reflector 212 returns through frequency converter 208, as indicated by reference number 228, at least a portion of the IR beam converts to visible light.

In this example, the beam-splitting surface within optical element 206, as indicated by reference number 218, reflects a range of visible light 90 degrees, as indicated by reference numeral 230, while transmitting other frequencies, including IR. The reflected visible light folds 90 degrees, as indicated by reference number 232, by a surface of 206*b* and outputs from laser module 200 in a direction parallel to the light transmitted through selective reflector 212, as indicated by reference number 234. The transmitted IR reflects off surface-emitter 204 and combines with the output from surface-emitter 204.

Other embodiments that require only a single output from laser module 200 may not reflect light within optical element 206. Such embodiments may comprise an optical element 206 that performs the function of polarizing without reflecting or redirecting light.

FIG. 3A shows an alternative embodiment of a portion of a laser module 300. Optical element 306 comprises a plurality of mirrors 306*a* and 306*b* disposed outwardly from a substrate 302. In this example, optical element 306 is capable of reflecting, polarizing, and beam-splitting light. Mirror 306*a* and 306*b* are positioned at right angles, in this embodiment. A beam-splitting and polarizing surface of mirror 306*b* reflects visible light while transmitting polarized IR. Mirror 306*a* reflects visible light and IR. Surface-emitter 304 is attached to substrate 302 inwardly from optical element 306.

FIG. 3B shows an alternative embodiment of a portion of a laser module 300. In this example, optical element 306 is capable of reflecting, polarizing, and beam-splitting light. Optical element 306 comprises one or more mirrors 306*a* attached to one or more total internal reflection (TIR) prisms 306*b* disposed outwardly from a common substrate. In this example, a beam-splitting and polarizing surface of prism 306*b* reflects visible light while transmitting polarized IR. Mirror 306*a* reflects visible light and IR. Surface-emitter 304 is attached to a common substrate inwardly from optical element 306.

FIG. 4 is a cross section view of one embodiment of a portion of laser module 400 comprising optical components attached to a common substrate. In this particular example, laser module 400 generates a single output.

In this example, surface-emitter 404 comprises a plurality of vertical-cavity surface-emitters that produce diffraction-limited Gaussian beams of infrared (IR) light; however, any suitable device that emits light that may be used directly or indirectly by a light modulator may be used.

In this example, the IR output from surface-emitter 404 is folded 90 degrees, as indicated by reference number 422, and polarized by optical element 406. Optical element 406 comprises a total internal reflection (TIR) prism. Although this example uses a TIR prism, other reflective elements may be used without departing from the scope of the present disclosure.

In this example, the IR output from optical element 406 passes through a frequency converter 408, which converts at least a portion of the IR beam into visible light. In this example, selective reflector 412 is capable of transmitting specific frequencies of visible light converted within frequency converter 408, while reflecting other frequencies of light. Laser module 400 outputs the visible light transmitted through selective reflector 412, as indicated by reference number 426.

In this example, light reflected from selective reflector 412 returns back through frequency converter 408. As the IR reflected from selective reflector 112 returns through frequency converter 408, as indicated by reference number 428, at least a portion of the IR beam converts to visible light.

In this example, the light returning from frequency converter 408 folds 90 degrees within optical element 406, as indicated by reference number 422, reflects off surface-emitter 404 and follows the same path as the output from surface-emitter 404.

Although the present invention has been described in several embodiments, a myriad of changes, variations, alterations, transformations, and modifications may be suggested to one skilled in the art, and it is intended that the present invention encompass such changes, variations, alterations, transformations, and modifications as falling within the spirit and scope of the appended claims.

What is claimed is:

1. A laser module comprising:

a substrate;

at least one prism, a frequency converter, a selective reflector, and at least one surface-emitter;

each positioned with respect to each other such that at least a portion of the light emission from the at least one surface-emitter travels through the at least one prism, through the frequency converter and through the selective reflector and at least another portion of the light emission cycles between the selective reflector and the at least one surface-emitter; and wherein each of the at least one prism, the frequency converter, the selective reflector, and the at least one surface-emitter is coupled to the substrate.

2. A laser module comprising:

a substrate;

an optical element, a frequency converter, a selective reflector, and a surface-emitter, positioned with respect to each other such that at least a portion of the light emission from the surface-emitter travels through the optical element, through the frequency converter, and through the selective reflector; and wherein the optical element, frequency converter, selective reflector, and surface-emitter are each coupled to the substrate.

3. The laser module of claim 2, wherein the surface-emitter and the optical element are positioned such that the optical element redirects at least a portion of the light emitted from the surface-emitter.

4. The laser module of claim 2, wherein the surface-emitter and the optical element are positioned such that the optical element does not redirect the light emission from the surface-emitter.

5. The laser module of claim 2, wherein the optical element polarizes at least a portion of the light emission from the surface-emitter.

6. The laser module of claim 2, wherein the optical element is capable of beam-splitting the light transmitted from the frequency converter such that light having a first set of frequencies is directed in a first direction and light having a second set of frequencies is directed in a second direction.

7. The laser module of claim 2, wherein the surface-emitter, the optical element, the frequency converter, and the selective reflector are further positioned such that at least a portion of the light emission from the surface-emitter may cycle between surface-emitter and the selective reflector.

8. The laser module of claim 2, wherein the surface-emitter forms a part of a vertical external cavity surface-emitting laser.

9. The laser module of claim 2, wherein the frequency converter comprises crystals capable of harmonic generation.

10. The laser module of claim 2, wherein the selective reflector is capable of selectively transmitting and reflecting specific frequencies of light.

11. The laser module of claim 2, wherein the frequency converter is temperature controlled by components coupled to the substrate and is substantially thermally isolated from the surface-emitter.

12. The laser module of claim 2, and further comprising a heat sink coupled to the substrate that controls the temperature of the surface-emitter.

13. The laser module of claim 2, wherein the optical element comprises one or more mirrors.

14. The laser module of claim 2, wherein the optical element comprises one or more prisms.

15. A method for frequency converting light generated by a surface-emitter comprising:

coupling a surface-emitter, an optical element, a frequency converter, and a selective reflector to a common substrate; and directing the coherent light emission from the surface-emitter through the optical element, and through the frequency converter to the selective reflector.

16. The method of claim 15, wherein the surface-emitter, the optical element, the frequency converter, and the selective reflector are positioned such that at least a portion of the light emission from the surface-emitter may cycle between the surface-emitter and the selective reflector through the frequency converter.

17. The method of claim 15, wherein the surface-emitter forms a part of a vertical external cavity surface-emitting laser.

18. The method of claim 15, wherein the frequency converter comprises crystals capable of harmonic generation.

19. The method of claim 15, wherein the surface-emitter and the optical element are positioned such that the optical element redirects at least a portion of the light emitted from the surface-emitter.

20. The method of claim 15, wherein the surface-emitter and the optical element are positioned such that the optical element does not redirect the light emission from the surface-emitter.

* * * * *